(12) United States Patent
Cadloni et al.

(10) Patent No.: US 11,953,980 B2
(45) Date of Patent: *Apr. 9, 2024

(54) MEMORY SUB-SYSTEM WITH DYNAMIC CALIBRATION USING COMPONENT-BASED FUNCTION(S)

(71) Applicant: Micron Technology, Inc., Boise, ID (US)

(72) Inventors: Gerald L. Cadloni, Longmont, CO (US); Bruce A. Liikanen, Berthoud, CO (US); Violante Moschiano, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/073,402

(22) Filed: Dec. 1, 2022

(65) Prior Publication Data

US 2023/0099349 A1 Mar. 30, 2023

Related U.S. Application Data

(63) Continuation of application No. 17/200,893, filed on Mar. 14, 2021, now Pat. No. 11,526,393, which is a continuation of application No. 16/013,031, filed on Jun. 20, 2018, now Pat. No. 10,990,466.

(51) Int. Cl.
*G06F 11/00* (2006.01)
*G06F 11/07* (2006.01)
*G11C 16/26* (2006.01)
*G11C 16/04* (2006.01)

(52) U.S. Cl.
CPC .......... *G06F 11/079* (2013.01); *G06F 11/073* (2013.01); *G06F 11/0751* (2013.01); *G11C 16/26* (2013.01); *G11C 16/0483* (2013.01)

(58) Field of Classification Search
CPC .. G06F 11/073; G06F 11/0751; G06F 11/079; G11C 16/26
See application file for complete search history.

(56) References Cited

U.S. PATENT DOCUMENTS

| | | |
|---|---|---|
| 7,437,498 B2 | 10/2008 | Ronen |
| 8,006,166 B2 | 8/2011 | Roohparvar et al. |
| 8,112,064 B2 | 2/2012 | Fukaya et al. |
| 9,092,350 B1 | 7/2015 | Jeon et al. |
| 9,117,536 B2 | 8/2015 | Yoon et al. |

(Continued)

FOREIGN PATENT DOCUMENTS

| | | |
|---|---|---|
| GB | 2383455 A | 6/2003 |
| GB | 2537484 A | 10/2016 |

(Continued)

OTHER PUBLICATIONS

EP Patent Application No. 18805869.7—Extended European Search Report, dated Jan. 22, 2021, 8 pages.

(Continued)

*Primary Examiner* — Joshua P Lottich
(74) *Attorney, Agent, or Firm* — Perkins Coie LLP

(57) ABSTRACT

An apparatus includes circuitry configured to generate multiple results, each result using a different read voltage, in response to one or each received data access command. The multiple read results may be used to dynamically calibrate a read voltage assigned to generate a read result in response to a read command.

20 Claims, 7 Drawing Sheets

(56) References Cited

U.S. PATENT DOCUMENTS

| | | |
|---|---|---|
| 9,153,336 B1 | 10/2015 | Yang et al. |
| 9,355,735 B1 | 5/2016 | Chen et al. |
| 9,367,391 B2 | 6/2016 | Lam |
| 9,454,420 B1 | 9/2016 | Tai et al. |
| 9,472,298 B1 | 10/2016 | Louie et al. |
| 9,558,850 B1 | 1/2017 | Bialas et al. |
| 9,761,308 B1 | 9/2017 | Cometti |
| 10,140,040 B1 | 11/2018 | Koudele et al. |
| 10,170,195 B1 | 1/2019 | Ioannou et al. |
| 10,210,926 B1 | 2/2019 | Amiri et al. |
| 10,276,233 B1 | 4/2019 | Danjean et al. |
| 10,379,739 B1 | 8/2019 | Bazarsky et al. |
| 10,388,376 B2 | 8/2019 | Molas et al. |
| 10,452,480 B2 | 10/2019 | Koudele et al. |
| 10,521,140 B2 | 12/2019 | Koudele et al. |
| 10,566,061 B2 | 2/2020 | Karakulak et al. |
| 10,566,063 B2 | 2/2020 | Sheperek et al. |
| 10,664,194 B2 | 5/2020 | Sheperek et al. |
| 10,877,827 B2 | 12/2020 | Miladinovic |
| 10,936,205 B2 | 3/2021 | Papandreou et al. |
| 10,963,327 B2 | 3/2021 | Camp et al. |
| 10,990,466 B2 | 4/2021 | Cadloni et al. |
| 11,176,036 B2 | 11/2021 | Camp et al. |
| 11,177,006 B2 | 11/2021 | Sheperek et al. |
| 11,347,405 B2 | 5/2022 | Koudele et al. |
| 11,416,173 B2 | 8/2022 | Sheperek et al. |
| 2002/0152459 A1 | 10/2002 | Bates et al. |
| 2005/0201148 A1 | 9/2005 | Chen et al. |
| 2006/0277429 A1 | 12/2006 | Dasari et al. |
| 2007/0025167 A1 | 2/2007 | Ziegelmayer et al. |
| 2007/0234144 A1 | 10/2007 | Gongwer et al. |
| 2009/0055680 A1 | 2/2009 | Honda et al. |
| 2009/0310404 A1 | 12/2009 | Cho et al. |
| 2010/0073069 A1 | 3/2010 | Wang et al. |
| 2010/0097857 A1 | 4/2010 | Cernea |
| 2010/0188919 A1 | 7/2010 | Fox et al. |
| 2011/0013460 A1 | 1/2011 | Dong et al. |
| 2011/0119431 A1 | 5/2011 | Chowdhury |
| 2011/0167307 A1 | 7/2011 | Mori |
| 2011/0305090 A1 | 12/2011 | Roohparvar et al. |
| 2012/0030531 A1 | 2/2012 | Brewerton et al. |
| 2012/0213001 A1 | 8/2012 | Yang |
| 2012/0236641 A1 | 9/2012 | Hu |
| 2012/0236653 A1 | 9/2012 | Spessot et al. |
| 2012/0254699 A1 | 10/2012 | Ruby et al. |
| 2013/0007543 A1 | 1/2013 | Goss et al. |
| 2013/0024743 A1 | 1/2013 | Sharon et al. |
| 2013/0117604 A1 | 5/2013 | Ha |
| 2013/0117635 A1 | 5/2013 | Ok et al. |
| 2013/0132652 A1 | 5/2013 | Wood et al. |
| 2013/0227200 A1 | 8/2013 | Cometti et al. |
| 2013/0346805 A1 | 12/2013 | Sprouse et al. |
| 2014/0026003 A1 | 1/2014 | Chen et al. |
| 2014/0068365 A1 | 3/2014 | Chen et al. |
| 2014/0119124 A1 | 5/2014 | Kim et al. |
| 2014/0136928 A1 | 5/2014 | Mu et al. |
| 2014/0143630 A1 | 5/2014 | Mu et al. |
| 2014/0153330 A1 | 6/2014 | Yoon et al. |
| 2014/0157065 A1 | 6/2014 | Ong |
| 2014/0281661 A1 | 9/2014 | Milton et al. |
| 2014/0281767 A1 | 9/2014 | Alhussien et al. |
| 2014/0355340 A1 | 12/2014 | Sharon et al. |
| 2014/0380123 A1 | 12/2014 | Liikanen et al. |
| 2015/0036432 A1 | 2/2015 | Huang |
| 2015/0085573 A1 | 3/2015 | Sharon et al. |
| 2015/0154064 A1 | 6/2015 | Ghaly et al. |
| 2015/0279473 A1 | 10/2015 | Yoo et al. |
| 2015/0309858 A1 | 10/2015 | Weilemann et al. |
| 2015/0378415 A1 | 12/2015 | George |
| 2016/0041891 A1 | 2/2016 | Malshe et al. |
| 2016/0092496 A1 | 3/2016 | Dietterich et al. |
| 2016/0099049 A1 | 4/2016 | Lee et al. |
| 2016/0099078 A1 | 4/2016 | Luo et al. |
| 2016/0117216 A1 | 4/2016 | Muchherla et al. |
| 2016/0132256 A1 | 5/2016 | Jung |
| 2016/0133334 A1 | 5/2016 | Zhang et al. |
| 2016/0147582 A1 | 5/2016 | Karakulak et al. |
| 2016/0148701 A1 | 5/2016 | Karakulak et al. |
| 2016/0148702 A1 | 5/2016 | Karakulak et al. |
| 2016/0148708 A1 | 5/2016 | Tuers et al. |
| 2016/0162185 A1 | 6/2016 | D'Abreu et al. |
| 2016/0179406 A1 | 6/2016 | Gorobets et al. |
| 2016/0218740 A1 | 7/2016 | Parthasarathy et al. |
| 2016/0225436 A1 | 8/2016 | Wang et al. |
| 2016/0232054 A1 | 8/2016 | Durgam et al. |
| 2016/0259693 A1 | 9/2016 | Sundararaman et al. |
| 2016/0266792 A1 | 9/2016 | Amaki et al. |
| 2017/0053714 A1 | 2/2017 | Guy et al. |
| 2017/0091039 A1 | 3/2017 | Hong |
| 2017/0097868 A1 | 4/2017 | Kim et al. |
| 2017/0126255 A1 | 5/2017 | Colgrove et al. |
| 2017/0148510 A1 | 5/2017 | Bazarsky et al. |
| 2017/0148525 A1 | 5/2017 | Kathawala et al. |
| 2017/0215111 A1 | 7/2017 | Lu et al. |
| 2017/0241843 A1 | 8/2017 | Jeon et al. |
| 2017/0263311 A1 | 9/2017 | Cometti |
| 2017/0269991 A1 | 9/2017 | Bazarsky et al. |
| 2017/0271031 A1 | 9/2017 | Sharon et al. |
| 2018/0189125 A1 | 7/2018 | Karlik et al. |
| 2018/0277228 A1 | 9/2018 | Takada et al. |
| 2018/0341416 A1 | 11/2018 | Koudele et al. |
| 2018/0341552 A1 | 11/2018 | Liikanen et al. |
| 2018/0341553 A1 | 11/2018 | Koudele et al. |
| 2018/0374550 A1 | 12/2018 | Barndt et al. |
| 2019/0043588 A1 | 2/2019 | Fisher et al. |
| 2019/0066802 A1 | 2/2019 | Malshe et al. |
| 2019/0103164 A1 | 4/2019 | Malshe et al. |
| 2019/0147964 A1 | 5/2019 | Yun et al. |
| 2019/0164599 A1 | 5/2019 | Avraham et al. |
| 2019/0171381 A1 | 6/2019 | Ioannou et al. |
| 2019/0172542 A1 | 6/2019 | Miladinovic |
| 2019/0278653 A1 | 9/2019 | Padilla et al. |
| 2019/0354312 A1 | 11/2019 | Chew et al. |
| 2019/0354313 A1 | 11/2019 | Sheperek et al. |
| 2019/0355426 A1 | 11/2019 | Sheperek et al. |
| 2019/0391865 A1 | 12/2019 | Cadloni et al. |
| 2020/0004440 A1 | 1/2020 | Koudele et al. |
| 2020/0004632 A1 | 1/2020 | Koudele et al. |
| 2020/0010459 A1 | 1/2020 | Van Dongen et al. |
| 2020/0019453 A1 | 1/2020 | Chew et al. |
| 2020/0019459 A1 | 1/2020 | Cadloni et al. |
| 2020/0117387 A1 | 4/2020 | Cadloni et al. |
| 2020/0118620 A1 | 4/2020 | Bazarsky et al. |
| 2020/0168282 A1 | 5/2020 | Sheperek et al. |
| 2020/0241801 A1 | 7/2020 | Sheperek et al. |
| 2020/0411117 A1 | 12/2020 | Malshe et al. |
| 2021/0012857 A1 | 1/2021 | Xie et al. |
| 2021/0027846 A1 | 1/2021 | Malshe et al. |
| 2021/0191638 A1 | 6/2021 | Miladinovic et al. |
| 2021/0200613 A1 | 7/2021 | Cadloni et al. |
| 2022/0036957 A1 | 2/2022 | Sheperek et al. |
| 2022/0391143 A1 | 12/2022 | Sheperek et al. |
| 2023/0057932 A1 | 2/2023 | Noh et al. |

FOREIGN PATENT DOCUMENTS

| | | | |
|---|---|---|---|
| KR | 20060054374 A | | 5/2006 |
| KR | 20090048130 A | | 5/2009 |
| KR | 20140072637 A | | 6/2014 |
| WO | 2005010638 A2 | | 2/2005 |

OTHER PUBLICATIONS

EP Patent Application No. 18806016.4—Extended European Search Report, dated Mar. 5, 2021, 12 pages.
EP Patent Application No. 18806327.5—Partial Supplementary European Search Report, dated Jan. 29, 2021, 16 pages.
EP Patent Application No. 19821879.4—Extended European Search Report, dated Feb. 1, 2022, 9 pages.
European Application No. 18805869.7—Examination Report dated Mar. 22, 2022, 7 pages.
International Application No. PCT/US2018/033873—International Search Report & Written Opinion, dated Sep. 7, 2018, 9 pages.

(56) References Cited

OTHER PUBLICATIONS

International Application No. PCT/US2018/033877—International Search Report & Written Opinion, dated Sep. 14, 2018, 22 pages.
International Application No. PCT/US2018/033881—International Search Report & Written Opinion, dated Sep. 14, 2018, 12 pages.
International Application No. PCT/US2019/033179—International Search Report and Written Opinion, dated Sep. 18, 2019, 12 pages.
Korean Patent Application No. 10-2019-7037973—Notice of Reasons for Rejection dated Apr. 8, 2022, 12 pages.
KR Patent Application No. 10-2019-7037973—Korean Office Action and Search Report, dated Dec. 7, 2020, with English Translation, 13 pages.
TW Patent Application No. 107117756—Taiwanese Office Action and Search Report, dated Jan. 31, 2019, 19 pages.
TW Patent Application No. 107117756—Taiwanese Search Report, dated Jul. 22, 2019, with English Translation, 2 pages.
TW Patent Application No. 107117813—Taiwanese Office Action and Search Report, dated Mar. 18, 2019, 17 pages.
PRC (China) Patent Application No. 201880042451.8—Office Action with English Translation dated Mar. 1, 2023, 11 pages.
Korean Patent Application No. 10-2022-7009917—Office Action with English Translation dated Jan. 26, 2023, 7 pages.
European Patent Application No. 18806016.4—Examination Report dated May 16, 2023, 6 pages.
European Patent Application No. 18806327.5—Examination Report dated Jun. 2, 2023, 9 pages.

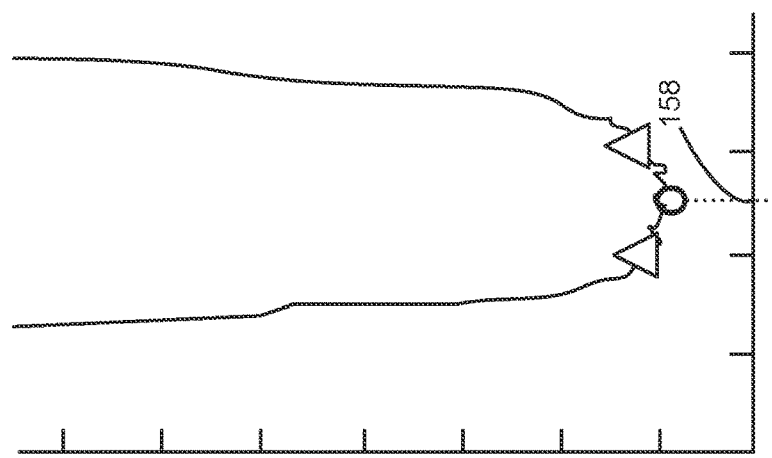
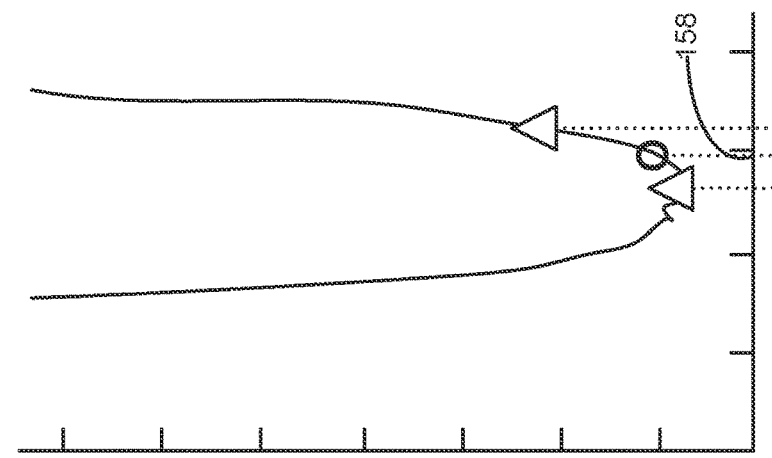
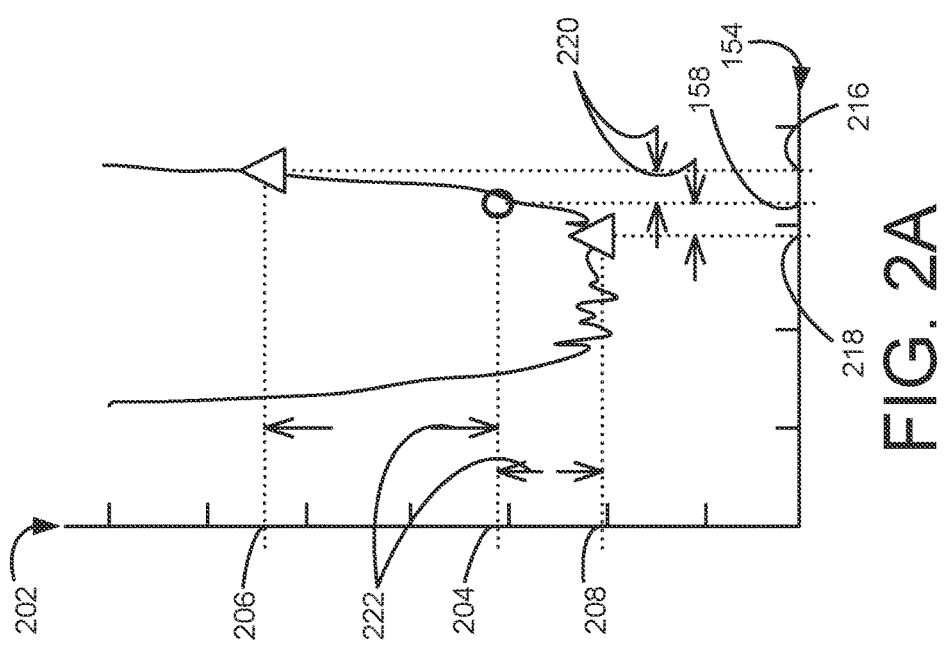

MEMORY SUB-SYSTEM WITH DYNAMIC CALIBRATION USING COMPONENT-BASED FUNCTION(S)

CROSS-REFERENCE TO RELATED APPLICATION(S)

This application is a continuation of U.S. application Ser. No. 17/200,893, filed Mar. 14, 2021, now U.S. Pat. No. 11,526,393, which is a continuation of U.S. application Ser. No. 16/013,031, filed Jun. 20, 2018, now U.S. Pat. No. 10,990,466; which are incorporated herein by reference in their entirety.

This application contains subject matter related to a previously-filed U.S. patent application by Bruce A. Liikanen and Larry J. Koudele titled "MEMORY DEVICE WITH DYNAMIC PROCESSING LEVEL CALIBRATION." The related application is assigned to Micron Technology, Inc., and is identified by application Ser. No. 15/605,858, which was filed on May 25, 2017.

This application contains subject matter related to a previously-filed U.S. patent application by Bruce A. Liikanen and Larry J. Koudele titled "MEMORY DEVICE WITH DYNAMIC TARGET CALIBRATION." The related application is assigned to Micron Technology, Inc., and is identified by application Ser. No. 15/605,855, which was filed on May 25, 2017.

This application contains subject matter related to a previously-filed U.S. patent application by Bruce A. Liikanen and Larry J. Koudele titled "MEMORY DEVICE WITH PROGRAMMING CALIBRATION." The related application is assigned to Micron Technology, Inc., and is identified by application Ser. No. 15/605,853, which was filed on May 25, 2017.

TECHNICAL FIELD

Embodiments of the disclosure relate generally to memory sub-systems, and, in particular, to memory sub-systems with dynamic calibration using component-based function(s).

BACKGROUND

Memory systems can employ memory devices to store and access information. The memory devices can include volatile memory devices, non-volatile memory devices, or a combination device. The non-volatile memory devices can include flash memory employing "NAND" technology or logic gates, "NOR" technology or logic gates, or a combination thereof.

Memory devices, such as flash memory, utilize electrical energy, along with corresponding threshold levels or processing voltage levels, to store and access data. However, the performance or characteristics of the flash memory devices change or degrade over time or usage. The change in performance or characteristics conflicts with the threshold or processing voltage levels over time, leading to errors and other performance issues. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 2A, 2B and 2C illustrate an example of a progression for the processing-level calibration mechanism in FIG. 1 in accordance with an embodiment of the present technology.

DETAILED DESCRIPTION

Figure 1:
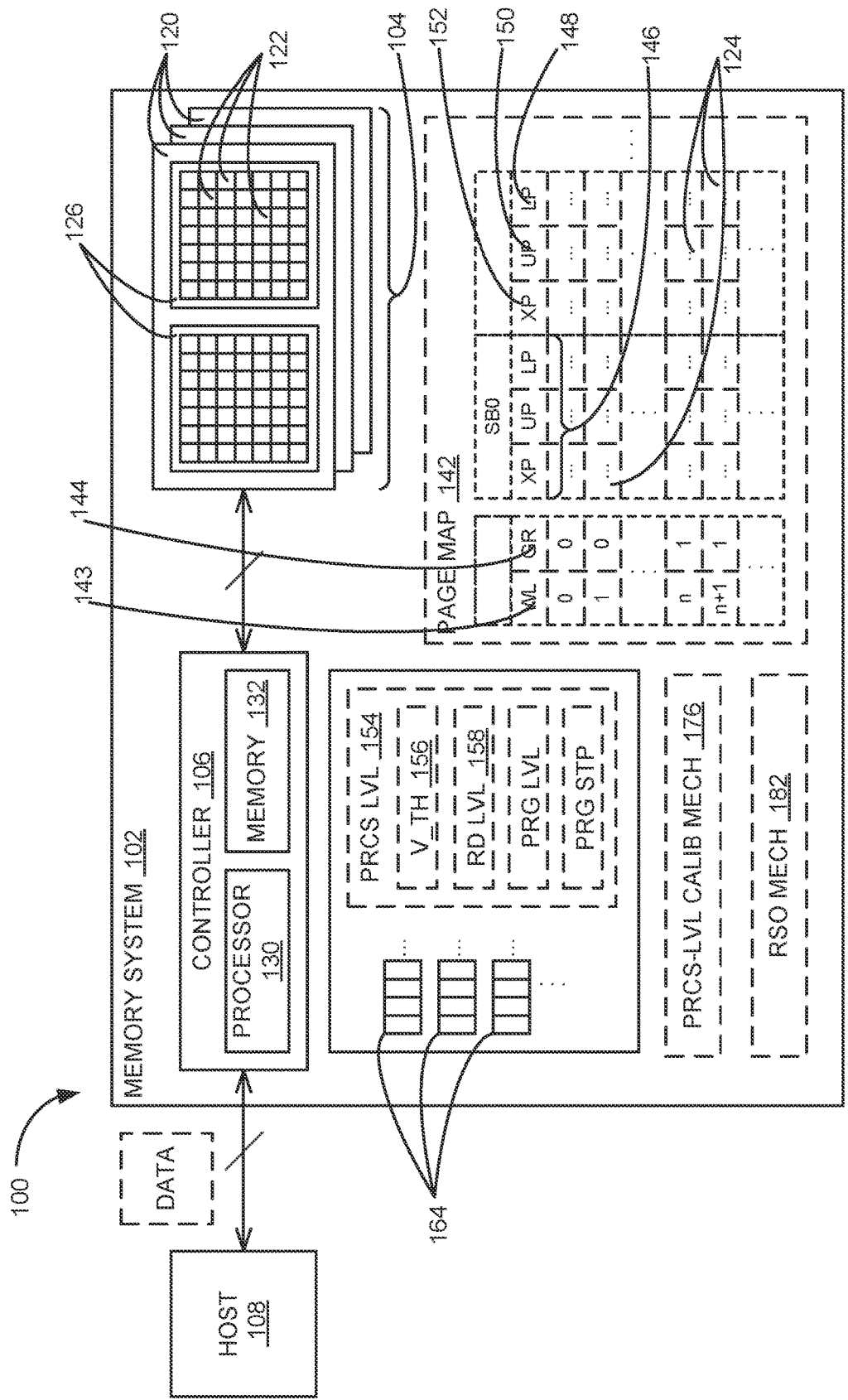
FIG. 1 illustrates an example computing environment that includes a memory system in accordance with some embodiments of the present disclosure.

Aspects of the present disclosure are directed to memory systems for dynamically and continuously calibrating processing levels (e.g., read levels). A memory system can be a storage system, such as a solid-state drive (SSD). In some embodiments, the memory system is a hybrid memory/storage system. In general, a host system can utilize a memory system that include media, such as one or more memory devices. The memory devices can include non-volatile memory devices, such as, for example, negative-and (NAND). In some embodiments, the memory system can further utilize phase change type memories (PCM), ferro-electric RAM (FRAM), etc. The host system can provide write requests to store data at the memory devices of the memory system and can provide read requests to retrieve data stored at the memory system.

Adjusting processing levels (e.g., read levels) often require multiple sampling operations. Each sampling operation can require a processing circuit (e.g., a memory device controller) to initiate and/or control the sampling operation. During such implementation of the sampling operations, the processing circuit is occupied and cannot conduct other functions. Thus, the processing level adjustments can increase a workload for the processing circuit and delay other tasks.

Aspects of the present disclosure address the above and other deficiencies by leveraging component-level functions to distribute the overall workload/resources, thereby increasing the overall efficiency of the memory systems. For example, the memory systems can use controllers therein to implement or control the overall calibration process. In gathering the samples, the controllers can leverage one or more embedded or preconfigured functions of memory components (e.g., NAND components/dies), such as a soft bit read (SBR) function or a similar/adjusted function, instead of issuing multiple read commands. In some embodiments, the NAND memory components can be configured to implement a read sample offset (RSO) function that performs multiple reads in response to a single command from the controllers. In some embodiments, the RSO function can perform three reads at three different read levels, such that one read is performed at a set or a center read level, one read above (e.g., n clicks or levels above) the set level, and one read below (e.g., n or m clicks or levels below) the set level. In some embodiments, the RSO function can perform five or more reads at corresponding number of different read levels.

The controllers can use the preconfigured memory functions to perform the multiple reads required for the continuous read-level calibration (cRLC) process, which reduces the workload of the controllers and down-time for the memory components. Accordingly, the controllers can perform other functions instead of issuing additional commands to perform a set of the required reads, and the memory components can perform the set of the required reads without waiting for the controllers to command each read.

The following embodiments are described in sufficient detail to enable those skilled in the art to make and use the embodiments. A person skilled in the relevant art, however, will understand that the technology may have additional embodiments and that the technology may be practiced without several of the details of the embodiments described below with reference to FIGS. 1-8.

FIG. 1 is a block diagram of a computing environment 100 with dynamic processing level calibration mechanism configured in accordance with an embodiment of the present technology. The computing system 100 includes a memory sub-system (also hereinafter referred to as a "memory system" (e.g., memory system 102)). An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. As shown, the memory system 102 includes one or more memory devices 104 (e.g., NAND flash) and a controller 106. The memory system 102 can operably couple the memory device 104 to a host device 108 (e.g., an upstream central processor (CPU)). The memory device 104 can include circuitry configured to store data in the memory device 104 and provide access to data in the memory device 104. The memory device 104 can be provided as semiconductor, integrated circuits and/or external removable devices in computers or other electronic devices. The memory device 104 includes one or more memory regions, or memory units 120. The memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory system 102 and/or the individual memory units 120 can also include other circuit components (not shown), such as multiplexers, decoders, buffers, read/write drivers, address registers, data out/data in registers, etc., for accessing and/or programming (e.g., writing) the data and other functionality, such as for processing information and/or communicating with the controller 106.

Each of the memory units 120 includes an array of memory cells 122 that each store data in a charge storage structure. The memory cells 122 can include, for example, floating gate, charge trap, phase change, ferroelectric, magnetoresistive, and/or other suitable storage elements configured to store data persistently or semi-persistently. The memory cells 122 can be one-transistor memory cells that can be can be programmed to a target state to represent information. For instance, electric charge can be placed on, or removed from, the charge storage structure (e.g., the charge trap or the floating gate) of the memory cell 122 to program the cell to a particular data state. The stored charge on the charge storage structure of the memory cell 122 can indicate a threshold voltage (Vt) of the cell. For example, a single level cell (SLC) can be programmed to a targeted one of two different data states, which can be represented by the binary units 1 or 0.

Some memory cells (e.g., flash memory cells) can be programmed to a targeted one of more than two data states. For example, a memory cell that can be programmed to any one of four states (e.g., represented by the binary 00, 01, 10, 11) can be used to store two bits of data, and may be referred to as a multilevel cell (MLC). Still other memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) for storing four bits of data. The memory cells 122 capable of storing higher numbers of data states can provide higher density memories without increasing the number of memory cells, since each cell can represent more than one digit (e.g., more than one bit).

The memory cells 122 can be arranged in rows (e.g., each corresponding to a word line 143) and columns (e.g., each corresponding to a bit line). Each word line 143 can include one or more memory pages 124, depending upon the number of data states the memory cells 122 of that word line 143 are configured to store. For example, a single word line of the memory cells 122 that are each configured to store one of two data states (e.g., SLC memory cells configured to store one bit each) can include a single memory page 124. Alternatively, a single word line 143 of the memory cells 122 that are each configured to store one of four data states (e.g., MLC memory cells configured to store two bits each) can include two memory pages 124. Moreover, within the word line 143, pages 124 can be interleaved so that the word line 143 of memory cells 122 that are each configured to store one of two data states (e.g., SLC memory cells) can include two pages, in an "even-odd bit line architecture" (e.g., where all the memory cells 122 in odd-numbered columns of a single word line 143 are grouped as a first page, and all the memory cells 122 in even-numbered columns of the same word line 143 are grouped as a second page). When even-odd bit line architecture is utilized in the word line 143 of memory cells 122 that are each configured to store larger numbers of data states (e.g., memory cells configured as MLC, TLC, QLC, etc.), the number of pages per word line 143 can be even higher (e.g., 4, 6, 8, etc.). Each column can include a string of series-coupled memory cells 122 coupled to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

The memory system 102 can process data using different groupings of the memory cells 122. For example, the memory pages 124 of the memory cells 122 can be grouped into memory blocks 126. In operation, the data can be written or otherwise programmed (e.g., erased) with regards to the various memory regions of the memory system 102, such as by writing to groups of pages 124 and/or memory blocks 126. In NAND-based memory, a write operation often includes programming the memory cells 122 in selected memory pages 124 with specific data values (e.g., a string of data bits having a value of either logic 0 or logic 1). An erase operation is similar to a write operation, except that the erase operation re-programs an entire memory block 126 or multiple memory blocks 126 to the same data state (e.g., logic 0).

In other embodiments, the memory cells 122 can be arranged in different types of groups and/or hierarchies than shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory system 102 can include only one memory unit 120. Alternatively, the memory system 102 can include two, three, four, eight, ten, or more (e.g., 16, 32, 64, or more) memory units 120. While the memory units 120 are shown in FIG. 1 as including two memory blocks 126 each, in other embodiments, each memory unit 120 can include one, three, four eight, or more (e.g., 16, 32, 64, 100, 128, 256 or more) memory blocks. In some embodiments, each memory block 123 can include, e.g., 215 memory pages, and each memory page within a block can include, e.g., 212 memory cells 122 (e.g., a "4k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. The processor 130 can be a processing device. In the illustrated example, the memory of the controller 106 includes an embedded memory 132 configured to perform various processes, logic flows, and routines for controlling operation of the computing system 100, including managing the memory system 102 and handling communications between the memory system 102 and the host device 108. In some embodiments, the embedded memory 132 can include memory registers storing, e.g., memory pointers, fetched data, etc. The embedded memory 132 can also include read-only memory (ROM) for storing microcode. While the exemplary memory system 102 illustrated in FIG. 1 has been illustrated as including the controller 106, in another embodiment of the present technology, a memory device may not include a controller, and may instead rely upon external control (e.g., provided by an external host, or by a processor or controller separate from the memory device).

In the illustrated example, further organization or details of the memory devices 104 are represented with a page map 142. The page map 142 can represent groupings, addresses, types, or a combination thereof for the memory pages 124 for each of the memory blocks 126. For example, each of the memory blocks 126 can include the memory pages 124 corresponding to a word-line group 144. Also for example, the memory pages 124 can further correspond to a logical page type 146, such as a lower page (LP) 148, an upper page (UP) 150, an extra page (EP) 152, or a top page (TP) (not shown).

The word-line group 144 can include a grouping of the memory pages 124 corresponding to one or more word lines 143 used to implement processing functions, such as read or write for the data. The word-line group 144 can be a grouping of the memory pages 124 for or connected to the word line 143. The word line 143 can correspond to physical layout or architecture of the memory cells 122.

The page type 146, such as for the UP 150, the LP 148, and the XP 152, can represent a grouping of bits in a specific order for the memory pages 124. The types of pages can correspond to a logical layout, architecture, or value for the memory cells 122. For example, the LP 148 can represent a first information bit stored in the memory pages 124 or the memory cells 122 therein. The LP 148 can be for SLC type of cells, MLC type of cells, TLC type of cells, or a combination thereof. Also for example, the UP 150 can correspond to or represent a second information bit stored in the memory pages 124 or the memory cells 122 therein. The UP 150 can be for the TLC or MLC types of the memory cells 122. Also for example, the XP 152 can represent a third information bit, such as for the most significant bit or the least significant bit, stored in the memory pages 124 or the memory cells 122 therein. The XP 152 can be for the TLC type of the memory cells 122.

The memory system 102 can use processing levels 154 for storing or accessing data. The processing levels 154 can include thresholds or operating levels for voltage or current. For example, the processing levels 154 can include a threshold voltage 156, a read level voltage 158, a programming level voltage, a programming step, or a combination thereof. The threshold voltage 156 can be the voltage applied to the control gate at which the circuitry for the memory cells 122 becomes conductive and a current can be measured. The threshold voltage 156 can be affected and controlled by controlling an amount of charge held in a floating gate or charge trap of the memory cells 122. The memory system 102 can store an amount of charge into the memory cells 122 based on the programming level voltage to represent a corresponding data value. The memory system 102 applies the programming level voltage to control gate or word line to charge up the floating gate or the charge trap. The floating gate or the charge trap can be electrically isolated, which can enable the memory cell to store and hold the charge.

The memory system 102 can use the stored charge to represent data. For example, storing charges on the floating gate or the charge trap can be for storing bit value of 0 for SLC type cells. Bit value of 1 can correspond to the floating gate or the charge trap with no stored charge for the SLC. In other types of cells, such as for MLC, TLC, or QLC, the memory system 102 can store specific amounts of charge on the floating gate or the charge trap to represent different bit values. The MLC type of cell can have four different charge states, TLC can have eight different charge states, and QLC can have 16 different charge states. Each of the charge states can correspond to a unique binary value as discussed above. In general, the memory pages can be any number of different types each configured to store different number of bits. The memory pages can be configured according $2^N$ number of states, wherein N corresponds to a number of bits per cell.

In some embodiments, the number of bits (N) can correspond to a non-integer number. For example, the memory pages can be configured to store 3.8125 bits per cell using 14 defined distribution states.

The memory system 102 can read or determine data values stored in the memory cells 122 using the read level voltage 158 corresponding to the data value. The memory system 102 can apply the read level voltage 158 to the control gate and measure the current or the voltage across the memory cell to read the data stored in the cell. The charges stored in the floating gate or the charge trap can screen off or offset the amount of charge placed on control gate for reading or accessing the stored data. As such, with the read level voltage 158 applied, the measured current or the voltage across the memory cell will correspond to the amount of charges stored in the floating gate or the charge trap.

During operation of the memory system 102, electrical characteristics of the device (i.e. charge retention capabilities) can change due to repeated data writes, erase, and/or reads. The repeated data operations can lead to breakdown or wearing of the structure electrically isolating the floating gate or the charge trap (e.g. the oxide layers). In accounting for the changing electrical characteristics of the memory cells 122, the memory system 102 can shift or calibrate the read level voltage 158.

The programming level voltage is associated with the read level voltage 158 and the threshold voltage 156. The programming level voltage, the read level voltage 158, the threshold voltage 156 or a combination thereof can correspond to the number of bits stored in the memory cells 122.

For example, memory cells 122 configured to store charge in one of two possible states (e.g., SLC memory cells) may have associated programming levels, read levels and threshold voltages that are different from those used with of memory cells 122 configured to store charge in one of four possible states (e.g., MLC memory cells) or memory cells 122 configured to store charge in one of eight possible states (e.g., TLC memory cells). For each type of memory cell (e.g., SLC, MLC, TLC, QLC, etc.), a specific value of the programming level voltage, the read level voltage 158, the threshold voltage 156, or a combination thereof can be associated with each of the possible data values. The memory system 102 can iteratively store charge in the memory cells 122 for the write or program operation, such as for incremental step pulse programming (ISPP). The programming step can include an increment or a voltage value for increasing the stored charge in each iteration. The memory system 102 can reach the programming level voltage by incrementally storing or increasing amounts of charge corresponding to the programming step.

The processing levels 154 can be stored in the memory system 102, the host device 108, or a combination thereof. For example, the memory system 102 can include one or more level registers 164 on the controller 106, the memory device 104, another memory location of the memory system 102, or a combination thereof for storing the processing levels 154. The level registers 164 can store the threshold voltage 156, the read level voltage 158, the programming level voltage, the programming step, or a combination thereof. The computing system 100, controller 106, and/or the host 108 can access the level registers 164, write or adjust the values in the level registers 164, or a combination thereof. Similarly, the processing levels 154 can be stored in the embedded memory of the controller 106, the memory device 104, another memory location of the memory system 102, or a combination thereof.

The computing system 100 can dynamically calculate or adjust the processing levels 154 based on feedback information. For example, the computing system 100 can continuously update the read level voltage 158 using a processing-level calibration mechanism 176. The processing-level calibration mechanism 176 can be a unique process, method, function, circuitry, configuration, or a combination thereof for implementing the above-mentioned calibration.

For illustrative purposes, the processing-level calibration mechanism 176 (e.g., cRLC) is described below using the read level voltage 158. However, it is understood that the processing-level calibration mechanism 176 can be implemented for the threshold voltage 156 of FIG. 1, the programming level voltage, the programming step, or a combination thereof.

In some embodiments, the computing system 100 can use an RSO mechanism 182 to implement the processing-level calibration mechanism 176. The RSO mechanism 182 can include a set of processes/sequences/instructions for performing multiple reads based on a single command. For example, the RSO mechanism 182 can be a function implemented or carried out by the memory device 104 (e.g., the NAND) based on a command (e.g., ONFi read command) from the controller 106. In response to a single command from the controller 106, the NAND can perform a set of multiple (e.g., three or five) reads for targeted memory cells 122 (e.g., a specific page). In some embodiments, the NAND can perform a read using a center read-level, one or more left/lower read-levels below the center read-level, and one or more right/higher read-levels above the center read-level.

FIGS. 2A, 2B, and 2C show charts correlating the error count (shown along the Y-axis) of a memory page with the read voltage (shown along the X-axis) used to read the data from the cells in accordance with an embodiment of the present technology. FIGS. 2A, 2B and 2C show a progression for the processing-level calibration mechanism 176 of FIG. 1. The processing-level calibration mechanism 176 can adjust the read level voltage 158 to reduce an error count as illustrated in FIG. 2A through FIG. 2C. The sampling portion, such as by reading the stored value using a particular read level, of the processing-level calibration mechanism 176 can be implemented using the RSO mechanism 182 and without the controller issuing individual/separate commands. While the figures illustrate an embodiment in which the calibration mechanism uses a measured error count to calibrate a read level voltage, the present technology may be used, in other embodiments, to similarly calibrate other processing levels (e.g., program voltage, threshold level, etc.) in view of other measured characteristics (bit error rate, etc.).

FIGS. 2A through 2C illustrate sequential changes, adjustments, or calibrations in the read level voltage 158 and the corresponding samples and results as the processing-level calibration mechanism 176 is implemented. The computing system 100 of FIG. 1 can implement the processing-level calibration mechanism 176 including iterative changes, adjustments, or calibrations in the read level voltage 158. The computing system 100 can further implement the processing-level calibration mechanism 176 multiple times over a duration to iteratively adjust the read level voltage 158.

FIG. 2A shows an example behavior prior to or in the absence of implementing the processing-level calibration mechanism 176. In initiating or implementing the processing-level calibration mechanism 176, the computing system 100 can use one or more of the components therein to sample data and generate or update a test measurement set.

The test measurement set can include a center result 204, a first offset result 206, a second offset result 208, other results, or a combination thereof. The computing system 100 can generate or update the test measurement set based on determining results corresponding to a set of read operations using the read level voltage 158 or using a voltage offset from the read level voltage 158.

For example, the computing system 100 can determine the center result 204 based on determining the error count corresponding to data read or accessed using the read level voltage 158 for a particular page type of an instance of the memory pages 124 of FIG. 1. The center result 204 corresponding to original, unadjusted, or uncalibrated instance of the read level voltage 158 is represented as "0" in FIG. 2A.

The computing system 100 can similarly determine the first offset result 206 based on determining the error count corresponding to data read or accessed using a first offset level 216. The computing system 100 can similarly determine the second offset result 208 based on determining the error count corresponding to data read or accessed using a second offset level 218. The first offset level 216 is indicated by the vertical dotted line leading from the x-axis up to the plot. The corresponding location of the plot is shown as a triangle located to the right and above the center result 204 in FIG. 2A. The second offset level 218 is indicated by the vertical dotted line leading from the x-axis to the plot with the corresponding location on the plot located to the left and below the center result 204 in FIG. 2A.

The first offset level 216 and the second offset level 218 can each be a voltage level for reading or accessing data stored in corresponding instances of the memory cells 122 of FIG. 1. The first offset level 216 and the second offset level 218 can be values different from each other and different from the read level voltage 158. For example, the first offset level 216 can be greater than the read level voltage 158. Also for example, the second offset level 218 can be lesser than the read level voltage 158.

Also for example, the first offset level 216, the second offset level 218, or a combination thereof can be offset from the read level voltage 158 by an offset measure 220. The offset measure 220 can represent a separation or an offset amount from the read level voltage 158 for one or more of the offset levels. In some embodiments, the offset measure 220 can be one or more clicks or units of movement. The offset measure 220 can further represent a direction or a sign, a degree or a magnitude, or a combination thereof for the separation or the offset.

In implementing the processing-level calibration mechanism 176, the memory system 102 can select a die, a memory block, a memory page, a trim or the read level voltage 158 corresponding to one page type for the page, or a combination thereof. The selection can be made at random or according to an iterative process/pattern. Following the selection, the computing system 100 can sample at least the center result 204, the first offset result 206 and the second offset result 208 for the test measurement set. In some embodiments, the memory system 102 can use the first offset level 216 and the second offset level 218 both offset from the read level voltage 158 by the offset measure 220 in opposite directions. The memory system 102 can use the center result 204, the first offset result 206 and the second offset result 208 to adjust or calibrate the read level voltage 158.

The computing system 100 can adjust, update, or calibrate the read level voltage 158 based on comparing or balancing the various results. In some embodiments, the computing system 100 can adjust or update the offset measure 220 between iterations and/or implementations for calibrating the read level voltage 158. In some embodiments, the computing system 100 can additionally calibrate the read level voltage 158 using the processing-level calibration mechanism 176 during or as part of manufacture, configuration, or set up of the memory system 102 of FIG. 1, before intended deployment or usage thereof.

FIG. 2B illustrates an example read level voltage 158 that has been adjusted or calibrated in comparison to the read level voltage 158 illustrated in FIG. 2A, in accordance with embodiments of the present disclosure. FIG. 2B can represent a moment (e.g., for one of the iterations) during implementation of the processing-level calibration mechanism 176 before the read level voltage 158 has settled or centered along the plot. The read level voltage 158 is illustrated in FIG. 2B as being lower or further left than in FIG. 2A. However, it is understood that the read level voltage 158 can be adjusted in any direction and by any increments or values. The processing-level calibration mechanism 176 can adjust the read level voltage 158 to decrease error rates or counts for the corresponding memory cells 122, such as according to current condition or characteristics of the memory cells 122.

The read level voltage 158 can be calibrated in a variety of ways. For example, the read level voltage 158 can be incremented or shifted by a predetermined amount or increment (e.g., clicks) based on comparing or balancing the various results. Also for example, the read level voltage 158 can be assigned a predetermined value corresponding to one or more results of the sampling process. Also for example, the read level voltage 158 can be replaced by the first offset level 216 or the second offset level 218 based on one or more of the results.

In some embodiments, the memory system 102 can use the updated/adjusted instance of the read level voltage 158 to calculate new offset levels. The memory system 102 can use the updated/adjusted value of the read level voltage 158 to read the data for latter or subsequent iterations/implementations of the processing-level calibration mechanism 176. The results of the corresponding reads can be processed, and the read level voltage 158 can further be calibrated accordingly. For example, between iterations, the controller 106 can adjust (e.g., increase or decrease) the read level voltage 158 according to the offset/read level that corresponds to the lowest amongst the center result 204, the first offset result 206, the second offset result 208, etc. Accordingly, the read level voltage 158, the first offset level 216, and the second offset level 218 can be different between/across the iterations as illustrated in FIG. 2A through FIG. 2C. The process can repeat periodically to continuously calibrate the read levels.

FIG. 2C illustrates an example behavior/condition at an end or after implementation of the processing-level calibration mechanism 176, in accordance with embodiments of the present disclosure. As illustrated, implementation of the processing-level calibration mechanism 176 can calibrate the read level voltage 158 to be located at or within a threshold distance from a bottom or minimum (e.g., center) of the error-read level correlation plot. The processing-level calibration mechanism 176 that uses the center result 204 and the one or more offset results provides the benefit of reducing errors introduced by reads. The processing-level calibration mechanism 176 can find the read level voltage 158 that reduces read errors based on iteratively testing different possible values of the read level voltage 158 and comparing the corresponding error counts.

The processing-level calibration mechanism 176 can iteratively calibrate the read level voltage 158 until the tested read level is estimated as the read level that generates the lowest error count/rate, such as being centered along the error/read-level plot as illustrated in FIGS. 2A-2C. In some embodiments, the controller 106 can estimate that the read level is centered based on differences from the center result 204 and the surrounding read levels have opposing signs (e.g., positive and negative). Further, the controller 106 can estimate the center status based on further determining equal or similar (e.g., within a threshold) magnitudes in the differences between the center result 204 and the surrounding read levels. In some embodiments, the controller 106 can estimate that the read level is centered when a calibration pattern changes across iterations. For example, the controller 106 can store whether the read level settings were increased or decreased during one or more of the previous iterations. The controller 106 can determine the dithering status when the adjustment direction changes (e.g., increase to decrease or vice versa). As illustrated in FIGS. 2A-2C, the controller 106 can determine the dithering status when the adjustments to the read level settings goes from decrease/subtraction operations, such as from adjusting the read level settings to move left, to increase/addition operation.

For illustrative purposes, FIGS. 2A-2C show the processing-level calibration mechanism 176 utilizing a set of three read levels (e.g., a center read level, a lower read level, and an upper read level) to generate the read samples. However, it is understood that the processing-level calibration mechanism 176 can utilize a set with a different number of read levels, such as two or more. For example, the processing-level calibration mechanism 176 can generate five read results that correspond to a center read level, a first lower level, a second lower level, a first higher level, and a second higher level. The first lower level can be lower than the center read level by the offset measure 220, and the second lower level can be lower than the first lower level by the offset measure 220. Also, the first higher level can be greater than the center read level by the offset measure 220, and the second higher level can be greater than the first higher level by the offset measure 220.

Figure 3A:
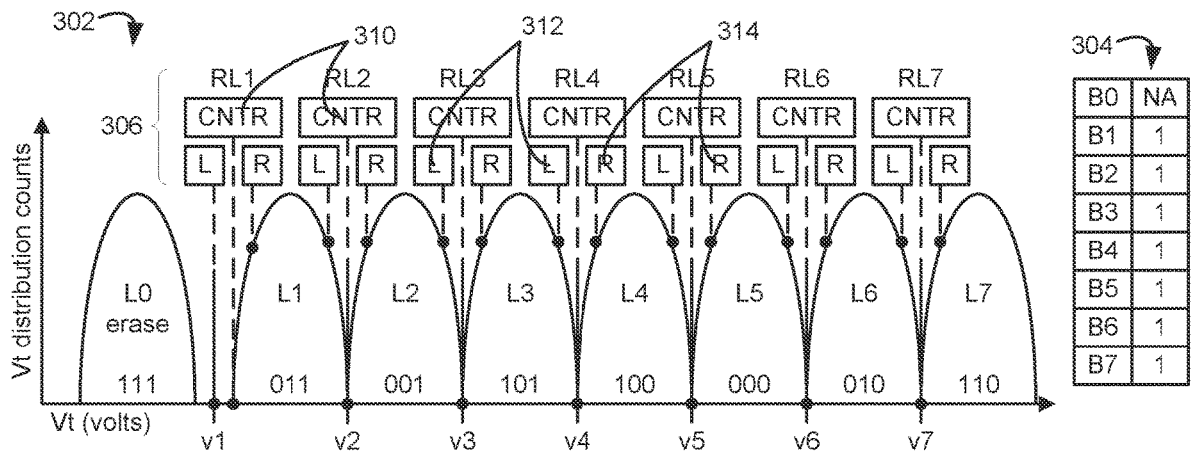
FIGS. 3A, 3B and 3C illustrate different control settings and corresponding read levels in accordance with an embodiment of the present technology.
Figure 3B:
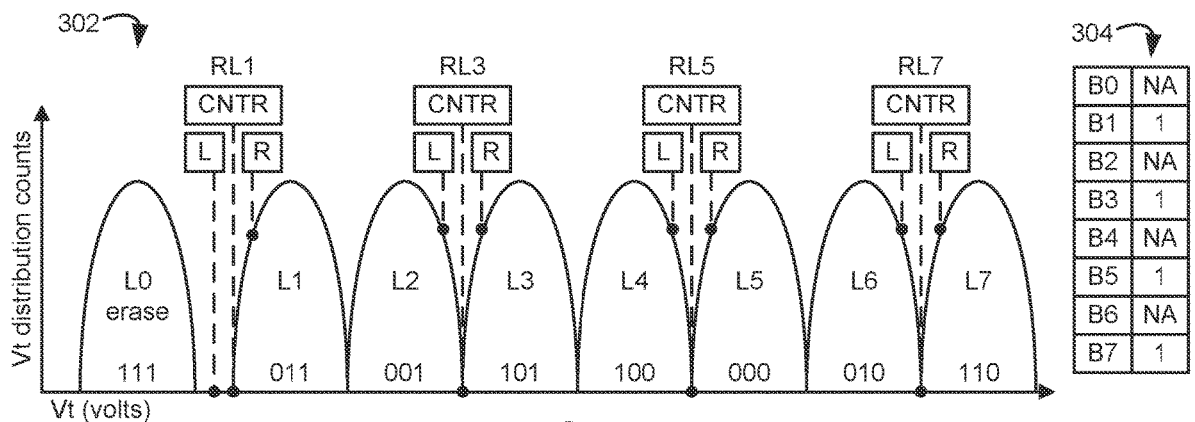
Figure 3C:
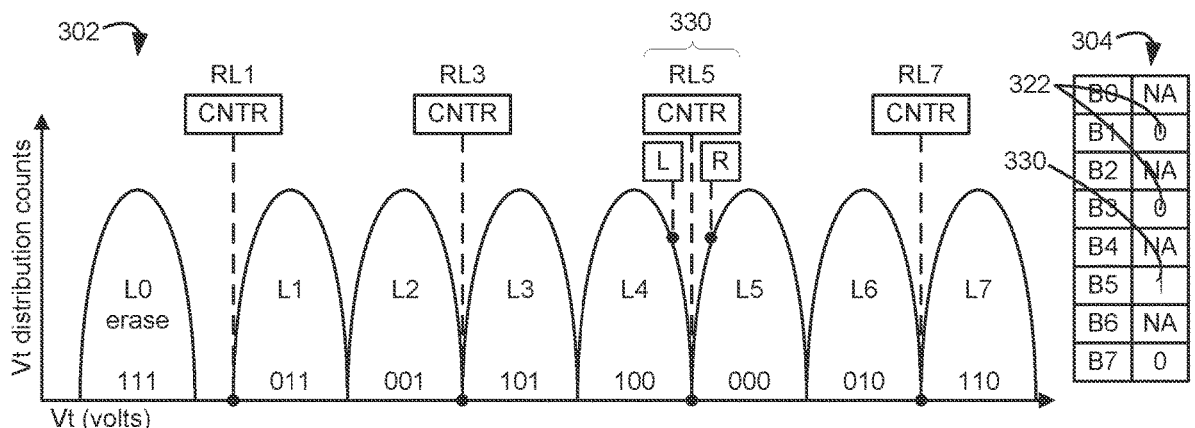

FIGS. 3A, 3B and 3C illustrate different control settings and corresponding read levels in accordance with an embodiment of the present technology. FIGS. 3A, 3B and 3C can each show a trim distribution profile 302 and tested read-levels that correspond to different read targets.

The trim distribution profile 302 show a distribution of program-verify (PV) levels according to the current behavior of a grouping of the memory cells, such as for a page (e.g., a TLC page), a logical or stored value, a word-line group, a word line, a die, or a combination thereof. For a TLC page, as illustrate in FIGS. 3A, 3B and 3C, the trim distribution profile 302 can correspond to the LP 148, the UP 150, and the XP 152, all shown in FIG. 1. The distributions can represent a number of occurrences for a specific trim level (e.g., read level) along a vertical direction or axis. The example illustrations show voltage levels along a horizontal direction or axis. The distributions can correspond to gray codes (e.g., logical values '111,' '011,' '110,' etc.), level groupings (e.g., 'L0,' 'L1,' 'L7,' etc.), a corresponding function/operation, such as an erase operation that sets all bits to '1' and sets the threshold voltage (Vt) below a threshold (e.g., the lowest threshold/read level), or a combination thereof.

The trim distribution profile 302 can include or represent distribution traces that show counts/quantities of different threshold voltages. The distribution traces can form a convex shape for each level (e.g., one of L0-L7) or bit value combination. The trim distribution profile 302 can further include or represent one or more distribution valleys that correspond to an intersection, a separation, an overlap, or a combination thereof between two adjacent distribution targets. The distribution valleys can each be between, at the boundary of, or a combination thereof between two adjacent instances of distribution traces. The distribution valleys can include read level voltages (e.g., different levels of the read level voltage 158).

For TLC pages, such as illustrated in FIGS. 3A-3C, there can be 7 valleys. The distribution valleys are each identified with a valley identification, such as v1-v7 shown in FIG. 3A. Each valley can correspond to a unique division or threshold for the LP 148, the UP 150, and the XP 152, which can be utilized to determine the content stored in the corresponding cells. Each of the distribution valleys can be associated with different read level voltages used to determine the LP 148, the UP 150, the XP 152, the bit value at the corresponding location, or a combination thereof. For TLC pages, there can be 7 different read level voltages, such as RL1-RL7 shown in FIG. 3A-3C.

For implementing the RSO mechanism 182 of FIG. 1, the computing system 100 (e.g., the memory device 104 of FIG. 1) can perform multiple reads for each distribution valley or associated read level setting. For example, the computing system 100 can perform multiple reads according to read sets 306 that each include a center read level 310, a left read level 312, a right read level 314, etc. Each of the read sets 306 can correspond to one of the read level settings/trims (e.g., one of RL1-RL7). The center read level 310 can be the read level voltage 158 (e.g., trim level) that is assigned by the controller 106 and/or that corresponds to the targeted memory cells/pages. The left read level 312 can be a read level that is lower than the center read level 310, such as by the offset measure 220 of FIG. 2. The right read level 314 can be a read level that is higher than the center read level 310, such as by the offset measure 220. The left read level 312 can function as the second offset level 218 of FIG. 2, and the right read level 314 can function as the first offset level 216 of FIG. 2. In some embodiments, the read sets 306 can include additional read levels, such as another left level that is lower than the left read level 312 (e.g., by the offset measure 220), another right level that is higher than the right read level 314 (e.g., by the offset measure 220), etc.

Also for implementing the RSO mechanism 182, the computing system 100 can include one or more control registers 304 (e.g., NAND registers). Each of the control registers 304 can correspond to a specific set of the memory cells 122, such as for the word-line group 144 of FIG. 1, the memory page 124, the page type 146 of FIG. 1, etc. The control registers 304 can be configured to target one or more read level settings for the calibration process, and control implementations of the multiple-reads for targeted level/setting. The mask register requirements can specify which valley or read level/setting is to be sampled. For example, bit 1 of the register can correspond to a first read level (e.g., 'RL1' corresponding to valley 'v1' between 'L0' and 'L1,' such as for XP), bit 2 can correspond to a second read level (e.g., 'RL2' corresponding to valley 'v2' between 'L1' and 'L2,' such as for UP), etc.

FIG. 3A illustrates a setting of the one or more registers 304 for enabling multiple (e.g., 3-strobe) reads from the LP, UP or XP of a TLC page. The register setting can include bit value '1' for each of the valleys (e.g., valleys 'v1' through 'v7'). Accordingly, the RSO mechanism 182 can perform a set of reads according to a read set for each valley.

FIG. 3B illustrates a setting of the one or more registers 304 for enabling multiple reads and a TLC page read from the XP (e.g., valleys 'v1,' 'v3,' 'v5,' and 'v7'). Accordingly, the RSO mechanism 182 can perform a set of reads according to a read set for each XP valley. Corresponding to the XP read, bits 1, 3, 5, and 7 can include a logical value (e.g., a logical '1' as shown in FIG. 3B or a logical '0' as shown in FIG. 3C). Other bits (e.g., bits 2, 4, and 6) that are not necessary for the targeted read (e.g., XP read) can be disabled. For example, bits of the control registers 304 that correspond to LP reads (e.g., '"v4') and upper (e.g., 'v2') and lower (e.g., 'v4') valleys for UP reads can be disabled (e.g., represented with 'X' in FIG. 3B) for the XP read. In some embodiments, reads from XP can be based on four read thresholds, UP can be based on two read thresholds, LP can be based on one read threshold, etc.

FIG. 3C illustrates a setting of the one or more registers 304 for enabling multiple reads from a targeted read setting (e.g., 'RL5' corresponding to valley 'v5'). To target a read level/setting, the one or more registers 304 can include a control mask set 322 (e.g., a set of one or more bit masks) that highlights a test target 330 (e.g., the targeted read level/setting). The computing system 100 can use the RSO mechanism 182 based on setting the control mask set 322 to highlight the test target 330 in setting up the processing-level calibration mechanism 176 (e.g., cRLC) to extract an error measure (e.g., a bit error rate, a bit error count, etc.) difference for the targeted read level/setting. For example, for targeting 'RL5,' the control registers 304 can include the control mask set 322 (e.g., bit value '0') that mask 'RL1,' 'RL3,' and 'RL7,' and highlights the test target 330 of 'RL5.' Accordingly, in response to one ONFi read command, the RSO TLC page read from the XP can provide results of the multiple reads (e.g., 3-strobe results) with the error measure limited to the contribution from 'RL5.'

The control registers 304 illustrated in FIG. 3C can include values corresponding to an XP read, similar to the values illustrated in FIG. 3B. However, instead of having '1' for targeting all XP read levels as illustrated in FIG. 3B, the control registers 304 can have a logical '1' for a single targeted valley (e.g., the test target 330, such as 'RL5' for FIG. 3C) in some embodiments. The other remaining bits can be masked (e.g., using a logical AND operation with predetermined logical values, such as '0') or flipped. According to the setting of the control registers 304, the NAND can perform a single read using the corresponding center read levels 310. For the test target 330, the NAND can perform the multiple strobe read (e.g., 3-strobe read as illustrated in FIG. 3C) according to the read set 306.

Figure 4:
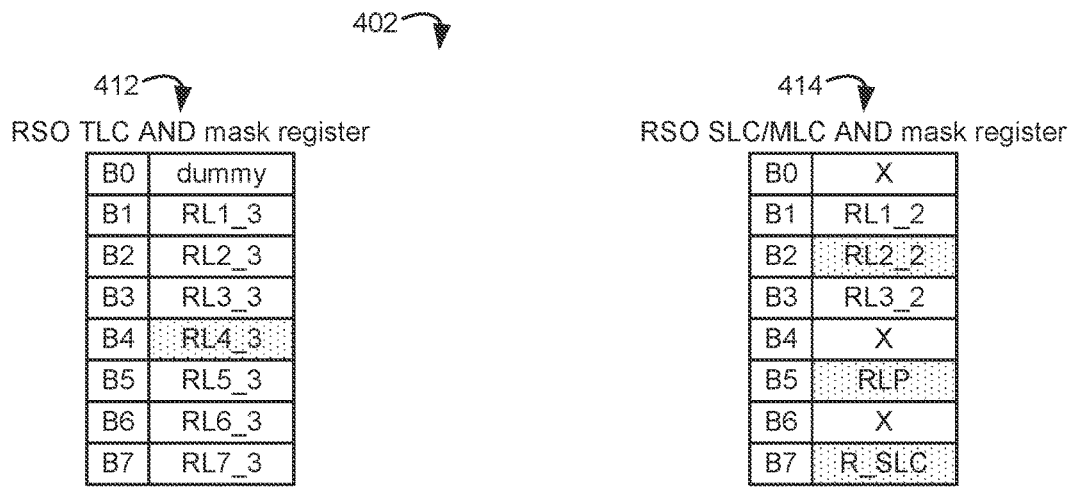
FIG. 4 illustrates a programming register set in accordance with an embodiment of the present technology.

FIG. 4 illustrates a programming register set 402 (e.g., one or more of the control register 304 of FIG. 3) in accordance with an embodiment of the present technology. In some embodiments, the programming register set 402 can include two standard 8-bit NAND registers (e.g., a first register 412 and a second register 414) configured to handle the mask register requirements discussed above. For example, the two 8-bit NAND registers can be for implementing the RSO mechanism 182 in a 2/8 programming TLC NAND die. The first register 412 can be for controlling reads of TLC pages, and the second register can be for controlling reads of SLC/MLC pages.

For example, the bits shown in shaded boxes (e.g., 'RL4_3,' 'RL2_2,' 'RLP,' and 'R_SLC') may not require a mask as they are single read threshold events. Out of the eight bits in the registers, six bits (e.g., bits 1-3 and 5-7 of the first register 412) can be designated for TLC (e.g., for UP and XP) and two bits (e.g., bits 1 and 3 of the second register 414) can be for MLC edge pages (e.g., UP). Also, TLC LP and SLC page types may not require any bits in the registers.

The registers can be without any bits dedicated for TLC LP-only first pass programmed prior to second pass program. The registers can further include a bit (e.g., bit-0 of the first register 412) configured to enable or disable a pre-dummy read sense. The pre-dummy read sense can include an initial read, such as before the set of sample-collecting reads, that is configured to eliminate transient reactions (e.g., transient Vt).

In implementing the processing-level calibration mechanism 176 of FIG. 1, the controller 106 of FIG. 1 can set register values of the programming register set 402 according to the read level/setting targeted for calibration. Along with the register values, the controller 106 can issue a command (e.g., an ONFi read command) to the NAND. In response to the command, the NAND can perform the multiple reads/strobe read for the test target 330 of FIG. 3 specified (e.g., unmasked) by the control mask set 322 of FIG. 3 applied to the programming register set 402.

Figure 5:
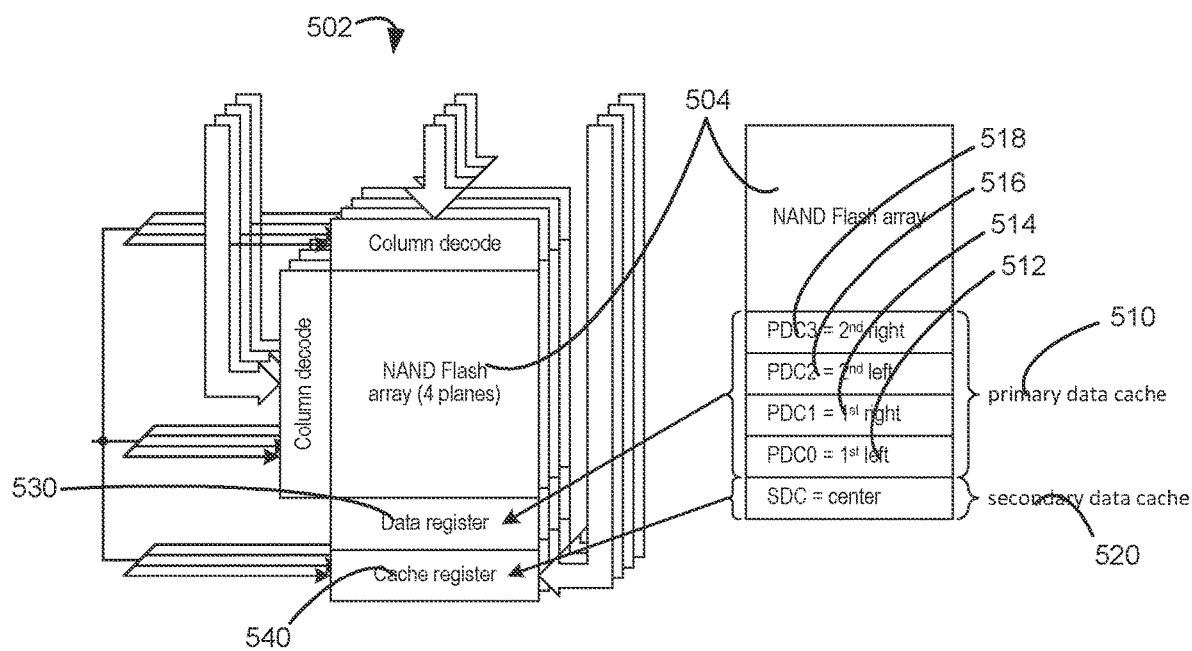
FIG. 5 illustrates a cache buffer configuration in accordance with an embodiment of the present technology.

FIG. 5 illustrates a cache buffer configuration 502 in accordance with an embodiment of the present technology. The cache buffer configuration 502 can be for cache memory (e.g., cache within or assigned to the memory units 120 of FIG. 1, such as the NAND flash array 504), configured to store information (e.g. read results and/or the read levels) for the RSO mechanism 182.

In some embodiments, the cache buffer configuration 502 can include a primary data cache 510 and a secondary data cache 520. The primary data cache 510 can include a portion (e.g., a designated set of registers) of data registers 530, and the secondary data cache 520 can include a portion (e.g., a designated set of registers) of cache registers 540. The secondary data cache 520 can correspond to the center read level 310 of FIG. 3. The primary data cache 510 can include a set of separate segments/cache, such as a first left cache (PDC0) 512, a first right cache (PDC1) 514, a second left cache (PDC2) 516, a second right cache (PDC3) 518, etc. For a 3-strobe mode, the first left cache 512 can correspond to the left read level 312, and the first right cache 514 can correspond to the right read level 314. The second left cache 516 and the second right cache 518 can correspond to additional read levels for a 5-strobe mode.

Figure 6:
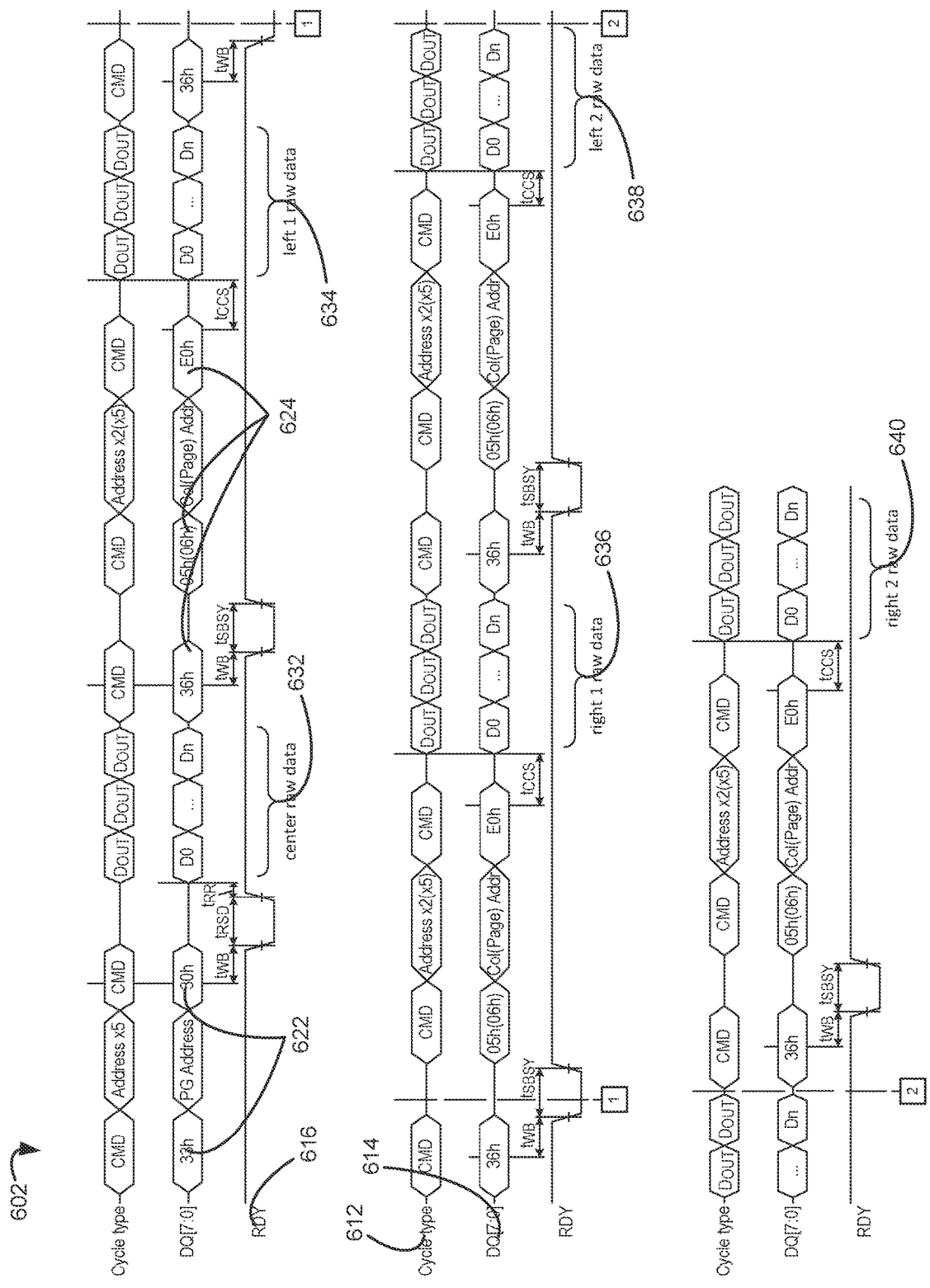
FIG. 6 illustrates a communication sequence in accordance with an embodiment of the present technology.

FIG. 6 illustrates a communication sequence 602 in accordance with an embodiment of the present technology. The communication sequence 602 can include exchange of data between the controller 106 of FIG. 1 and the memory device 104 of FIG. 1, such as for implementing the RSO mechanism 182 of FIG. 1 in implementing the processing-level calibration mechanism 176 of FIG. 1. The communication sequence 602 in FIG. 6 can illustrate a cycle type 612, communicated data 614, and a timing diagram 616 associated with the exchange. For example, the cycle type 612 can illustrate a categorical description of the exchanged data. Also, the communicated data 614 can illustrate an example of actual data/command that is communicated between the components. Also, the timing diagram 616 can illustrate a timing associated with the communication.

The communication sequence 602 can include one or more commands from the controller 106 to the memory device 104, a reaction or data reported by the memory device 104 to the controller 106, etc. As illustrated in FIG. 6, the controller 106 can issue to the memory device 104 a single ONFi command (e.g., RSO read command 622, illustrated as '33$h$-30$h$') to initiate the RSO mechanism 182. In response to receiving the command, the memory device 104 can perform a predetermined set of reads. For example, for a 3-strobe mode, the memory device 104 can perform reads using a center level, a left level, and a right level. Also, for a 5-strobe mode, the memory device 104 can perform reads using a center level, a first left level, a first right level, a second left level, and a second right level. The reads for the 5-strobe mode can be complete during the tRSD timing. The read results can be stored in the many NAND data cache holding registers. If dummy read is enabled according to the programming register set 402 of FIG. 4, the memory device 104 can perform the dummy read before the predetermined set of reads. The memory device 104 can perform the reads during a time window illustrated as '$t_{WB}$,' '$t_{RSB}$,' '$t_{RR}$,' etc.

Following the reads, the memory device 104 can report a first read result, such as a center read result 632 that corresponds to the center read level. In some embodiments, the memory device 104 can automatically communicate the first read result to the controller 106 in response to the RSO read command 622, such as without any additional commands or prompts from the controller 106. Before and/or after reporting, the memory device 104 can store the first read result in the secondary data cache 520 of FIG. 5 (e.g., the cache register 540 of FIG. 5).

The RSO mechanism 182 can further include processes, protocol, instructions, configurations, etc. for obtaining the remaining read results. For example, according to the RSO mechanism 182, the controller 106 can issue one or more subsequent commands (e.g., RSO output command set 624, illustrated as '36*h*,' '05*h*,' and then 'E0*h*,') to receive one or more of the remaining read results.

In some embodiments, one communication of the RSO output command set 624 from the controller 106 to the memory device 104 can invoke communication of all of the remaining results from the memory device 104 to the controller 106. In some embodiments, each communication of the RSO output command set 624 from the controller 106 to the memory device 104 can invoke communication of one of the remaining read results. Before and/or after reporting, the memory device 104 can store the remaining read results in the primary data cache 510 of FIG. 5 (e.g., the data registers 530 of FIG. 5).

In responding to the report command, the memory device 104 can communicate the remaining read results to the controller 106 according to a predetermined pattern. As illustrated in FIG. 6, the memory device 104 can report according to a sequence of a first left result 634 (e.g., a read result corresponding to a first left level), followed by a first right result 636 (e.g., a read result corresponding to a first right level), followed by a second left result 638 (e.g., a read result corresponding to a second left level), and ending with a second right result 640 (e.g., a read result corresponding to a second right level). For the 3-strobe mode, the memory device 104 can report up to the first right result 636.

In some embodiments, the memory device 104 can store and report the read results as raw data. For example, the memory device 104 can store and/or send the various read results without compressing the data and/or without encoding the data.

Figure 7:
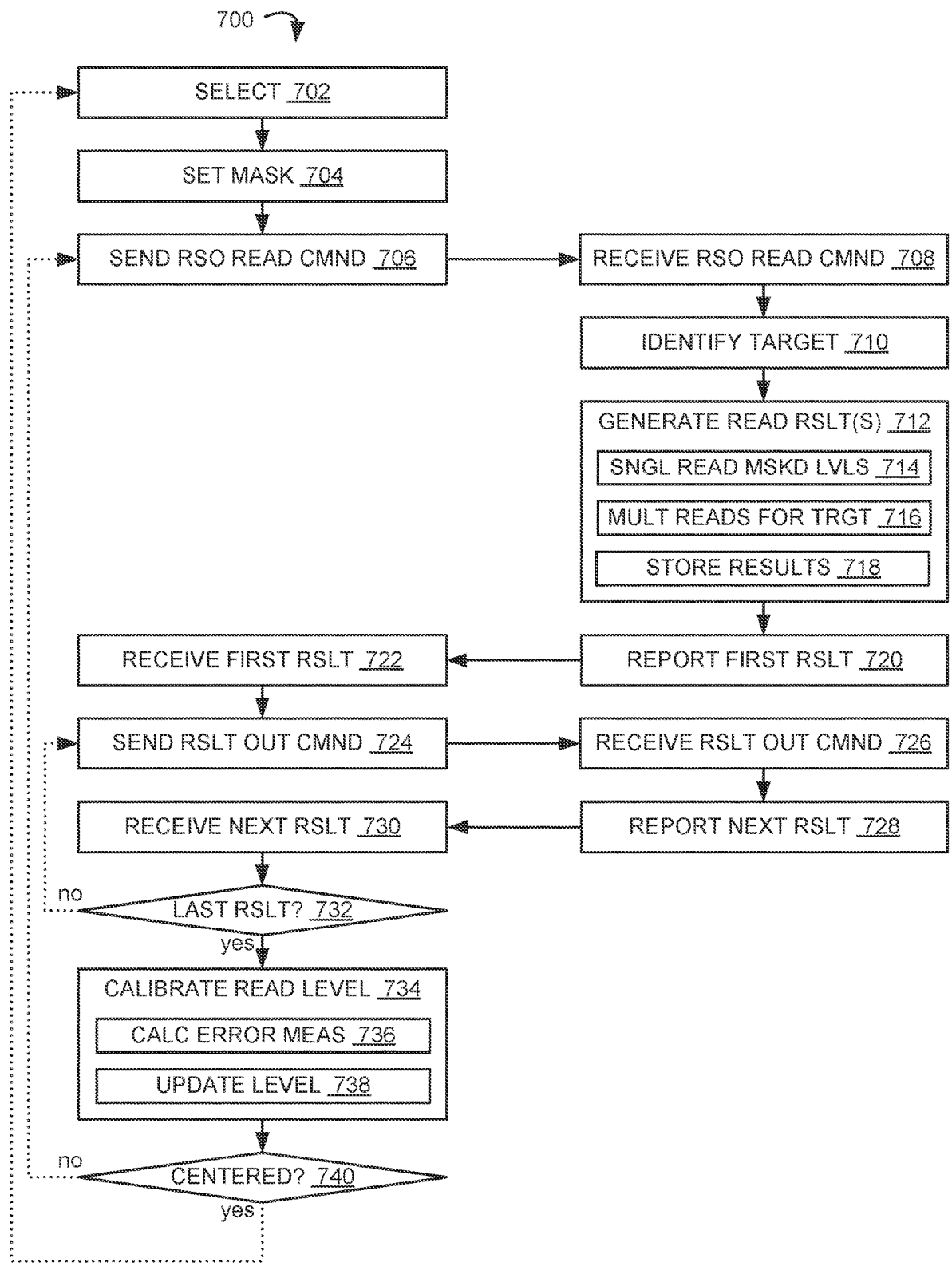
FIG. 7 is a flow diagram of an example method for dynamically and continuously calibrating processing levels in accordance with an embodiment of the present technology.

FIG. 7 is a flow diagram illustrating an example method 700 for calibrating a read level in accordance with an embodiment of the present technology. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the RSO mechanism 182 of FIG. 1. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 702, the processing device selects a grouping of the memory cells 122 of FIG. 1 as a target of the calibration process. For example, the processing device can select one of the memory pages 124 of FIG. 1 that is fully-programmed. The selected page can correspond to one or more page types based on the type of selected cells, such as for SLC, MLC, and TLC. The selected page can further correspond to one of the word-line groups 144 and the word line 143, both of FIG. 1. The page selection can be made randomly, iteratively, or a combination thereof. In some embodiments, the processing device can select the page randomly, such as according to a set of instructions/processes for making random selections. In some embodiments, the processing device can select the page according to a predetermined order. The processing device can also select the page based on iteratively selecting through the available/fully-programmed pages.

At block 704, the processing device can determine the test target 330 of FIG. 3 for the calibration process. For example, the processing device can determine the test target 330 as one of the distribution valleys or the corresponding read level associated with the selected page. In some embodiments, the processing device can select the test target 330 randomly, such as according to a set of instructions/processes for making random selections. In some embodiments, the processing device can select the test target 330 according to a predetermined order. The processing device can also select the test target 330 based on iteratively selecting the read levels associated with the selected page.

For determining the test target 330, the processing device can set one or more registers for the programming register set 402 of FIG. 4. The processing device can set the values in the one or more registers according to the control mask set 322 of FIG. 3. For example, the processing device can assign/set logical '0' for the bits in the mask register that correspond to the non-selected read levels. The processing device can assign/set logical '1' for the bit(s) in the mask register that correspond to the test target 330.

At block 706, the processing device can communicate the RSO command for performing multiple reads. For example, the processing device can send the RSO read command 622 of FIG. 6 (e.g., a ONFi read command) to the memory device 104 of FIG. 1. The processing device can send the RSO read command 622 as a single command that initiates the memory device 104 to perform multiple reads at different read levels. The RSO read command 622 can be associated with reading the targeted page, such as for the LP 148, the UP 150, the XP 152, etc.

At block 708, the memory device 104 can receive the RSO command from the processing device. Based on receiving a single RSO command from the processing device, the memory device 104 can perform multiple reads. For example, the memory device 104 can perform two or more reads in response to the single commands.

At block 710, the memory device 104 can identify the targeted read level/valley for performing the multiple reads. The memory device 104 can identify the test target 330 based on accessing the programming register set 402 or the control register 304 of FIG. 3 therein. For example, the memory device 104 can determine the test target 330 as the read level(s)/distribution valley(s) that corresponds to the bit in the register having a logical value of '1.'

At block 712, the memory device 104 can perform the reads corresponding to the received commands to generate the read results. For example, at block 714, the memory device 104 can perform single reads for non-targeted read levels of the targeted page. For the example illustrated in FIG. 3C, the memory device 104 can perform single reads for read levels/trims 'RL1,' 'RL3,' and 'RL7' of the XP read. The memory device 104 can perform the single reads using the assigned read level voltage, such as center levels.

Also, at block 716, the memory device 104 can perform multiple reads for the test target 330. For example, the processing device, the memory device 104, or a combination thereof can access the level register 164 of FIG. 1 to get the trim or the read set 306 of FIG. 3 corresponding to the LP 148, the UP 150, the XP 152, or a combination thereof. In some embodiments, the processing device can identify the targeted page and communicate the corresponding identifier with the command. The memory device 104 can access the level register 164 to get the trim corresponding to the test target 330.

The memory device 104 can further identify the read set 306 corresponding to the test target 330. For example, the memory device 104 can identify the read set 306 based on accessing a predetermined set of levels. Also for example, the memory device 104 can identify the read set 306 based on calculating the first and/or second left level(s) and the first and/or second right level(s) based on the accessed trim. The memory device 104 can set the accessed trim/read level as the center read level 310 of FIG. 3, the first left level (e.g., the center level minus the offset measure 220 of FIG. 2) as the left read level 312 of FIG. 3, and the first right level (e.g., the center level plus the offset measure 220) as the right read level 314 of FIG. 3. The memory device 104 can similarly set the second left level as the center level minus twice the offset measure 220 and the second right level as the center level plus twice the offset measure 220.

The memory device 104 can perform the multiple reads according to the identified read set 306. In some embodiments, the memory device 104 can perform a number of reads corresponding to the read set 306. In some embodiments, the memory device 104 can perform a predetermined number of reads. For example, the memory device 104 can read using the center read level 310, the left read level 312, and the right read level 314 for the 3-strobe mode illustrated in FIG. 3C. Also, the memory device 104 can additionally read using a second left level (e.g., a read voltage level less than the left read level 312 by the offset measure 220 of FIG. 2) and a second right level (e.g., a read voltage level greater than the right read level 314 by the offset measure 220) for the 5-strobe mode illustrated in FIG. 6.

The memory device 104 can generate the center result 204 of FIG. 2 (e.g., the center read result 632 of FIG. 6) by reading using the center read level 310, generate the first offset result 206 of FIG. 2 (e.g., the first right result 636 of FIG. 6) using the right read level 314, and generate the second offset result 208 of FIG. 2 (e.g., the first left result 634 of FIG. 6) using the left read level 312. Similarly, the memory device 104 can generate the second right result 640 of FIG. 6 by reading the memory cells using the second right level, and generate the second left result 638 of FIG. 6 by reading with the second left level.

In some embodiments, the memory device 104 can perform an additional read or a dummy read before implementing the multiple reads to generate the multiple read results. The memory device 104 can perform the dummy read for the test target 330, the targeted page, etc. The dummy read can be an initial read of the targeted set of memory cells. The dummy read can be performed to eliminate transient reactions from the targeted set of memory cells.

At block 718, the memory device 104 can store the multiple read results in designated locations. For example, the memory device 104 can store the center result 204/center read result 632 in the secondary data cache 520 of FIG. 5, such as the cache register 540 of FIG. 5 or a portion therein. Also, the memory device 104 can store the other results in the primary data cache 510 of FIG. 5, such as the data registers 530 of FIG. 5 or a portion therein. In some embodiments, the memory device 104 can store the first left result 634 in the first left cache 512 of FIG. 5, the first right result 636 in the first right cache 514 of FIG. 5, the second left result 638 in the second left cache 516 of FIG. 5, the second right result 640 in the second right cache 518 of FIG. 5, etc.

At block 720, the memory device 104 can report the first of the read results. For example, the memory device 104 can send the center result 204/center read result 632 to the processing device. The memory device 104 can automatically send the first result in response to the RSO mechanism 182, without any additional commands/communication from the processing device. At block 722, the processing device can receive at least the first result. In some embodiments, the memory device 104 can automatically send all of the read results that correspond to the read set.

In some embodiments, after reporting the first read result, the memory system 102 can implement an iterative reporting and/or requesting process to access the remainder of the read results. For example, the processing device can send a set of one or more report commands (e.g., the RSO output command set 624 of FIG. 6) to the memory device 104, and the memory device 104 can iteratively report all of the remaining read results in response.

Also, as illustrated in blocks 724-732, the processing device can iteratively send a set of one or more report commands and receive the next-remaining read result. At block 724, the processing device can send the RSO output command set 624 to the memory device 104 to retrieve the next-remaining read result. At block 726, the memory device 104 can receive the RSO output command set 624. At block 728, the memory device 104 can report/send the next-remaining read result to the processing device. For example, as illustrated in FIG. 6, the memory device 104 can report the first left result 634 in response to the first issuance of the RSO output command set 624. In some embodiments, the memory device 104 can report according to a sequence of the first left result 634, the first right result 636, the second left result 638, the second right result 640, etc. In some embodiments, the memory device 104 can report based on iteratively incrementing a pointer within the primary data cache 510.

At block 730, the processing device can receive the next-remaining read result. At block 732, the processing device can determine whether the received result is the last of the remaining results, and if not, the control flow can pass back to block 724. Accordingly, the memory system 102 can iteratively send/receive the next-remaining read result until all of the read results are communicated form the memory device 104 to the processing device.

When the processing device receives the last of the remaining results according to block 732, the processing device can begin the analysis of the results for the calibration process. At block 734, the processing device can calibrate the read level for the targeted valley/read setting based on the reported read results. The processing device can calibrate based on generating an updated processing level that lowers the error rate. For example, the calibration analysis can include calculating error measures, such as at block 736. The processing device can calculate error measures (e.g., an error count or BER) that correspond to the different read results. At block 738, the processing device can compare the error rates and generate the updated processing level corresponding to the lower of the error measure. In some embodiments, the processing device can generate the updated processing level based on storing in the level register 164 the tested read level (e.g., the center level, the left level, the right level, etc.) having the lowest error measure. In some embodiments, the processing device can adjust, such as incrementing up or down, the read level setting in the level register 164 by a predetermined amount (e.g., n clicks). The processing device can adjust in a direction corresponding to the lowest error measure.

At block 740, the processing device can determine whether the read level setting is centered. In some embodiments, the processing device can store a direction of the adjustment. The processing device can determine that the read level is centered based on detecting a dither condition, such as when the direction of the adjustments change. In some embodiments, the processing device can calculate differences between the center-error result and a left/right-error result. The processing device can further calculate a difference between the magnitudes of the two differences (e.g., a difference in error measures of the center read and the left read and a difference in error measures of the center read and the right read). The processing device can determine that the read level is centered when the difference in the two magnitudes are below a predetermined threshold.

When the read level setting is not centered, the flow can pass back to block 706. Accordingly, the processing device can reinitiate the RSO mechanism 182. The memory device 104 can repeat the reads based on the updated processing level instead of the previous read level setting. As a result, the processing device and the memory device 104 can iteratively update the read level settings until the read level setting is determined as being centered.

When the read level setting of the tested page/memory cells is/are centered, the processing device can determine whether the processing-level calibration mechanism 176 has considered all of the targeted pages. The controller can reset the overall iterations, such as for a next set of iterations for the continuous calibration process, when the processing-level calibration mechanism 176 has considered all of the targeted pages. When the processing device determines that one or more of the targeted pages remain or have not been centered, the flow can pass to block 702. Accordingly, the processing device can select one of the remaining pages/memory blocks and repeat the above described process.

Iteratively calibrating the processing levels 154 (e.g., the read level voltage 158) based on leveraging a multiple-read function (e.g., the RSO mechanism 182) implemented by the memory device 104 provides improved system efficiency. Instead of issuing the multiple read commands, the processing device can issue one command (e.g., the RSO read command 622) to implement the multiple reads. As a result, the processing device can be freed up to perform other functions instead of issuing the multiple reads. Further, down times can be eliminated in the memory device 104, since the memory device 104 can execute the multiple reads without having to wait for each of the commands. Accordingly, the overhead for running the processing-level calibration mechanism 176 can be improved. Further, the method 700 discussed above can be implemented regardless of the ECC soft data correction engines.

Figure 8:
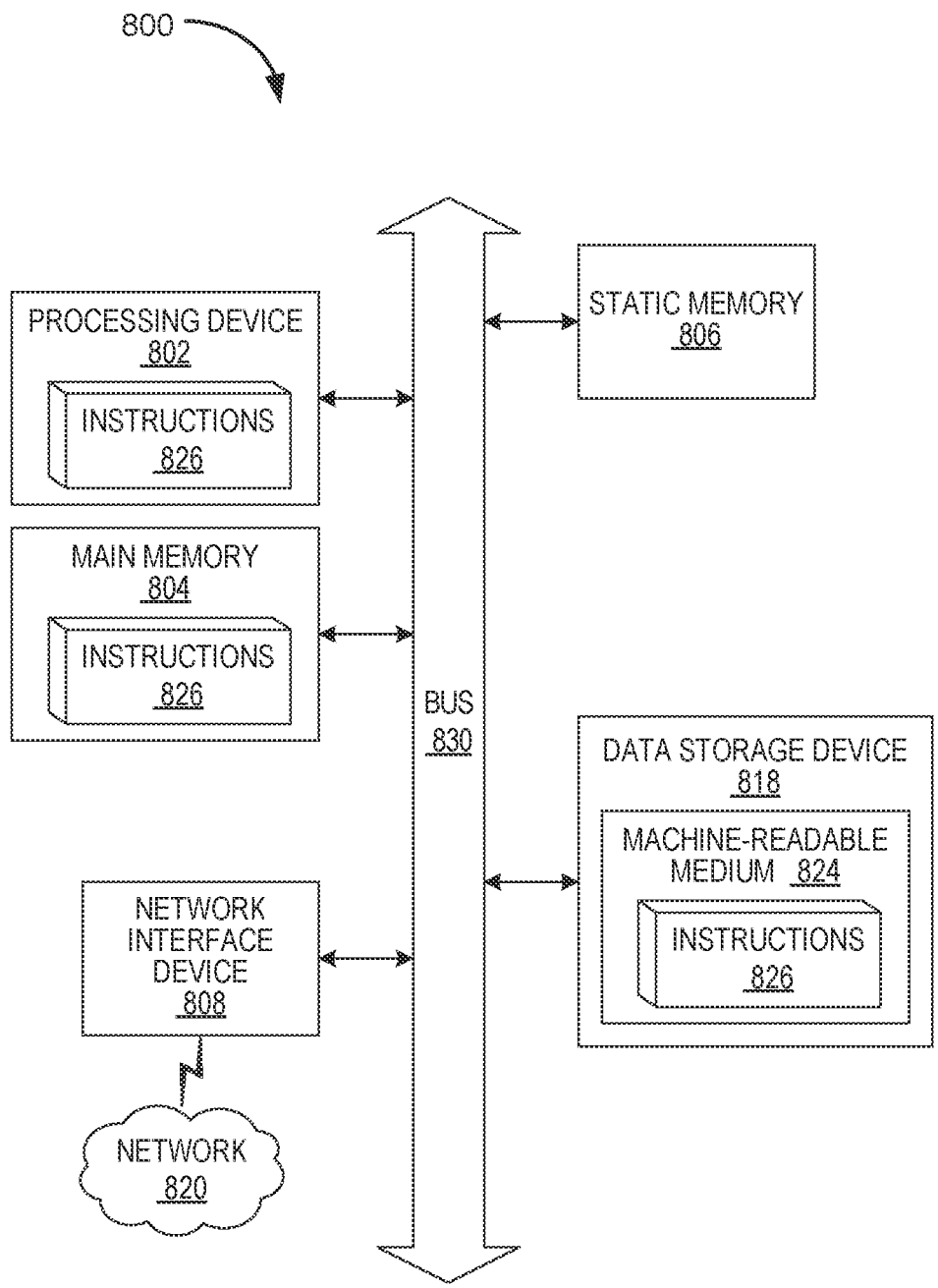
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some implementations, the computer system 800 can correspond to a host system (e.g., the host 108 of FIG. 1) that includes or utilizes a memory system (e.g., the memory system 102 of FIG. 1) or can be used to perform the operations of a controller (e.g., to execute an operating system to perform operations corresponding to the convergence mechanism 130 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random-access memory (DRAM) such as synchronous DRAM (SDRAM) or Rambus DRAM (RDRAM), etc.), a static memory 806 (e.g., flash memory, static random-access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions or software 826 embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory system 102 of FIG. 1.

In one implementation, the instructions 826 include instructions to implement functionality corresponding to a convergence mechanism (e.g., the convergence mechanism 130 of FIG. 1). While the machine-readable storage medium 824 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

We claim:

1. An apparatus comprising:
a circuit configured to generate, in response to a data access command from a controller during read level voltage calibration, two or more read results based on reading a set of memory cells using a read level voltage along with at least one offset read voltage, wherein --
the two or more read results are generated as samples used in calibrating the read level voltage initially configured for use in response to a read command.

2. The apparatus of claim 1, wherein:
the circuit configured to generate the two or more read results is a first circuit;
further comprising:
a second circuit coupled to the first circuit and configured to receive the data access command from the controller.

3. The apparatus of claim 2, wherein the first and second circuits and the set of memory cells comprise a Flash memory device.

4. The apparatus of claim 1, wherein the circuitry is further configured to:
identify a targeted read setting designated by the controller for the set of memory cells; and
identify a read set that corresponds to the test read setting, wherein the read set includes the two or more read results.

5. The apparatus of claim 4, wherein the identified target read setting includes:
a plurality of bits that each correspond to a read level specific to a page type, and
a control mask set masking one or more bits in the target read setting separate from the test target.

6. The apparatus of claim 1, wherein the data access command is a single command that is configured to operate the circuit to perform multiple read operations on the corresponding set of memory cells with different read voltages.

7. The apparatus of claim 6, wherein the circuit is configured to respond to the data access command by outputting to the controller one read result from one of the multiple read operations.

8. The apparatus of claim 7, wherein the circuit is configured to provide, in response to an output command, one or more remaining read results from a remainder of the multiple read operations.

9. The apparatus of claim 6, wherein the circuit includes an internal storage circuit configured to store the two or more read results and/or corresponding read voltages.

10. The apparatus of claim 1, wherein the circuit is configured to implement a dummy read to perform an initial read of the set of memory cells before generating the two or more read results, wherein the dummy read is for eliminating transient reactions instead of accessing targeted data.

11. A method comprising:
receiving a data access command from a controller during read level voltage calibration; and
in response to one or each received data access command, generating two or more read results based on reading a set of memory cells using a read level voltage along with at least one offset read voltage, wherein --
the two or more read results are generated as samples used in calibrating the read level voltage initially configured for use in response to a read command.

12. The method of claim 11, further comprising:
storing the two or more read results; and
providing a first of the two or more read results to the controller at a time different than a second of the two or more read results.

13. The method of claim 12, further comprising:
receiving a second command after the data access command, wherein providing the first and the second of the two or more read results at different times includes:
providing the first of the two or more read results as a response to the data access command; and
providing the second of the two or more read results as a response to the second command.

14. The method of claim 11, further comprising:
accessing a control register to identify a targeted read setting for the set of memory cells; and
identifying a read set that corresponds to the test target, wherein the read set includes the two or more read results.

15. The method of claim 11, further comprising performing a dummy read to eliminate transient reactions before generating the two or more read results.

16. The method of claim 11, further comprising:
based on the two or more read results, determining error rates for each of the read level voltage and the at least one offset read voltage; and
dynamically the read level voltage to one of the voltages having a lowest error rate within the set of error rates.

17. The method of claim 16, wherein:
the at least one offset read voltage includes (1) a positive offset voltage greater than the read level voltage and (2) a negative offset voltage less than the read level voltage, wherein the positive and negative offset voltages correspond to a shared offset magnitude;
the set of error rates includes (1) a positive offset rate corresponding to the positive offset voltage, (2) a negative offset rate corresponding to the negative offset voltage, and (3) a center rate corresponding to the read level voltage; and
dynamically calibrating the read level voltage includes (1) increasing the read level voltage when the positive offset rate is the lowest error rate or (2) decreasing the read level voltage when the negative offset rate is the lowest error rate.

18. A system comprising circuitry configured to:
generate, in response to a data access command from a controller received during read level voltage calibration, two or more read results based on reading a set of memory cells using a read level voltage along with at least one offset read voltage;
determine an error rate for each of the read level voltage and the at least one offset read voltage based on the two or more read results; and
update the read level voltage based on selecting from the at least one offset read voltage when the corresponding error rate is lower than that of the initial read level voltage.

19. The system of claim 18, wherein the circuitry comprises a memory controller.

20. The system of claim 18, wherein:
the memory device comprises a non-volatile storage device; and
the data access command is different from a read command configured to generate a read result based on reading the set of memory cells using the read level voltage.

* * * * *